(12) United States Patent
McGinty et al.

(10) Patent No.: US 7,126,314 B2
(45) Date of Patent: Oct. 24, 2006

(54) NON-SYNCHRONOUS BOOST CONVERTER INCLUDING SWITCHED SCHOTTKY DIODE FOR TRUE DISCONNECT

(75) Inventors: John McGinty, Redwood City, CA (US); Andrew Cowell, Masterton (NZ)

(73) Assignee: Micrel, Incorporated, San Jose, CA (US)

( * ) Notice: Subject to any disclaimer, the term of this patent is extended or adjusted under 35 U.S.C. 154(b) by 0 days.

(21) Appl. No.: 11/051,586

(22) Filed: Feb. 4, 2005

(65) Prior Publication Data

US 2006/0176029 A1    Aug. 10, 2006

(51) Int. Cl.
*G05F 1/10*    (2006.01)
(52) U.S. Cl. ..................................... 323/222
(58) Field of Classification Search ............... 323/222, 323/351, 282, 285
See application file for complete search history.

(56) References Cited

U.S. PATENT DOCUMENTS

| | | | | |
|---|---|---|---|---|
| 4,801,983 | A * | 1/1989 | Ueno et al. | 257/390 |
| 5,132,748 | A * | 7/1992 | Yano | 257/477 |
| 5,258,640 | A | 11/1993 | Hsieh et al. | |
| 5,430,323 | A | 7/1995 | Yamazaki et al. | |
| 6,185,082 | B1 * | 2/2001 | Yang | 361/90 |
| 6,229,293 | B1 * | 5/2001 | Farrenkopf | 323/288 |
| 6,310,466 | B1 * | 10/2001 | Criscione | 323/222 |
| 6,476,442 | B1 * | 11/2002 | Williams et al. | 257/328 |
| 6,580,252 | B1 * | 6/2003 | Yu | 323/222 |
| 2006/0033480 | A1 * | 2/2006 | Soldano | 323/225 |
| 2006/0062026 | A1 * | 3/2006 | Wittenbreder | 363/21.06 |

OTHER PUBLICATIONS

Linear Technology Data Sheet for LT3464, "Micropower Boast Converter with Schottky and Output Disconnect in ThinSOT™," pp. 1-16.
Micrel Data Sheet for MIC2290, "2mm×2mm PWM Boost Regulator with Internal Schotty Diode," Aug. 2004, pp. 1-12.
Micrel Data Sheet for MIC2288, "1A 1.2PWM Boost Converter in Thin SOFT-23 and 2×2 MLF™," Aug. 2004, pp. 1-12.

* cited by examiner

*Primary Examiner*—Karl Easthom
*Assistant Examiner*—Harry Behm
(74) *Attorney, Agent, or Firm*—Patent Law Group LLP; Carmen C. Cook

(57) ABSTRACT

A non-synchronous boost converter includes a switched Schottky diode to rectify the switched output voltage of the boost converter where the switched Schottky diode has forward conduction blocking capability. The switched Schottky diode has an anode terminal coupled to receive the switched output voltage, a cathode terminal providing the output DC voltage, and a gate terminal coupled to receive a control signal. The control signal has a first state for turning the switched Schottky diode on where the switched Schottky diode conducts current when forward biased and a second state for turning the switched Schottky diode off where forward conduction of the switched Schottky diode is blocked even when the diode is forward biased. The switched Schottky diode can be a JFET controlled or an LDMOS gate controlled Schottky diode. Furthermore, the switched Schottky diode can be formed on-chip or off-chip of the controller circuit of the boost converter.

12 Claims, 1 Drawing Sheet

NON-SYNCHRONOUS BOOST CONVERTER INCLUDING SWITCHED SCHOTTKY DIODE FOR TRUE DISCONNECT

CROSS-REFERENCE TO RELATED APPLICATIONS

This application is related to the following commonly assigned U.S. patent applications: Ser. No. 11/051,520, entitled "JFET Controlled Schottky Barrier Diode," of Shekar Mallikarjunaswamy; and Ser. No. 11/031,201, entitled "LDMOS Gate Controlled Schottky Diode," of Shekar Mallikarjunaswamy. The aforementioned patent applications are incorporated herein by reference in their entireties.

FIELD OF THE INVENTION

The invention relates to voltage converters and, in particular, to a non-synchronous boost converter using a switched Schottky Diode to disconnect the switched output voltage from the output load.

DESCRIPTION OF THE RELATED ART

Step-up converters, or boost converters, are known in the art and operate by taking a DC input voltage and regulating a higher DC output voltage. FIG. 1 is a circuit diagram illustrating a typical circuit configuration of a conventional non-synchronous boost converter. In general, boost regulation of the output voltage $V_{OUT}$ is achieved by turning on an internal switch, which draws current through an inductor L1. When the internal switch turns off, the inductor's magnetic field collapses, causing the voltage at the switch output ($V_{SW}$) to increase until it forward-biases Schottky diode D1, charging up output capacitor C2 to a voltage higher than the input voltage $V_{IN}$.

In the conventional non-synchronous boost converter, the Schottky diode D1 is used to rectify the switched output voltage $V_{SW}$ of the boost converter. The Schottky diode (D1) is connected between the switched output voltage $V_{SW}$ and the output voltage $V_{OUT}$ in such a way as to form a direct DC current path from the switched output voltage $V_{SW}$ to the load attached to the output voltage $V_{OUT}$ terminal. When the boost converter is not being used, such as when the boost converter is disabled by deasserting the Enable signal, the DC current path remains which results in undesirable current flow through the Schottky diode to the output load. The DC current path increases the leakage current of the converter. Such leakage current is not desirable particularly when the boost converter is being used in a battery application where the leakage current can drain the battery, reducing the battery life. Therefore, it is desirable to disconnect the DC current path through the Schottky diode to eliminate the leakage current.

One solution used in the industry is to use synchronous rectification by using a MOSFET switch instead of the Schottky diode. But synchronous rectification requires additional level shifting and driving circuitry for the MOSFET that impacts the efficiency of the voltage converter at higher voltages. Another solution is to use a switch, such as a PNP bipolar transistor, to disconnect the Schottky diode from the output load. However, the switch must operate in a manner so as not to increase the forward voltage drop, adversely impacting conversion efficiency. In one proposed solution, a PNP bipolar transistor is used to disconnect the Schottky diode from the output load. The PNP bipolar transistor must be biased near saturation and a bypass capacitor is needed to ensure stability of the converter circuit. The biasing scheme of the PNP bipolar transistor can be complex and the additional capacitor required for stability increases component counts and cost of the converter circuit.

SUMMARY OF THE INVENTION

According to one embodiment of the present invention, a non-synchronous boost converter receiving an input DC voltage and providing an output DC voltage greater than the input DC voltage includes a controller, a switched Schottky diode, an inductor, a capacitor and a voltage divider. The controller is coupled to receive the input DC voltage on an input voltage terminal and generate a switched output voltage on a switched output voltage terminal. The controller further receives an enable signal on an enable terminal and a feedback voltage on a feedback terminal. The enable signal is asserted to turn on the boost converter and is deasserted to turn off the boost converter. The switched Schottky diode has an anode terminal coupled to the switched output voltage terminal, a cathode terminal providing the output DC voltage, and a gate terminal coupled to receive a control signal. The control signal has a first state for turning the switched Schottky diode on where the switched Schottky diode conducts current when forward biased and a second state for turning the switched Schottky diode off where forward conduction of the switched Schottky diode is blocked even when the switched Schottky diode is forward biased. The inductor is coupled between the input DC voltage terminal and the switched output voltage terminal. The capacitor is coupled between the output voltage terminal and a first power supply voltage. Finally, the voltage divider is coupled between the output voltage terminal and the first power supply voltage where the voltage divider provides the feedback voltage at an output node of the voltage divider.

In one embodiment, the switched Schottky diode is an on-chip Schottky diode formed on the same integrated circuit as the controller. In another embodiment, the switched Schottky diode is an off-chip Schottky diode formed on an integrated circuit separate from the same integrated circuit of the controller.

Furthermore, in one embodiment, the switched Schottky diode is a JFET controlled Schottky diode. In another embodiment, the switched Schottky diode is an LDMOS gate controlled Schottky diode.

The present invention is better understood upon consideration of the detailed description below and the accompanying drawings.

DETAILED DESCRIPTION OF THE PREFERRED EMBODIMENTS

In accordance with the principles of the present invention, a boost converter includes a switched Schottky diode to rectify the switched output voltage of the boost converter where the switched Schottky diode has forward conduction blocking capability. Specifically, the switched Schottky diode has an anode terminal coupled to receive the switched output voltage and a cathode terminal providing the DC output voltage of the boost converter. The switched Schottky diode further includes a gate terminal coupled to receive a control signal for turning the switched Schottky diode on and off. When an enable signal coupled to the gate terminal is asserted to turn the switched Schottky diode on, the switched Schottky diode operates as a normal Schottky diode. When the enable signal coupled to the gate terminal is deasserted to turn the switched Schottky diode off, no forward current flows through the switched Schottky diode even when the anode terminal is forward biased relative to the cathode terminal. In this manner, the forward conduction of the switched Schottky diode can be blocked when the boost converter in which the Schottky diode is incorporated is disabled. The leakage current experienced by the boost converter of the present invention is significantly reduced.

Figure 1:
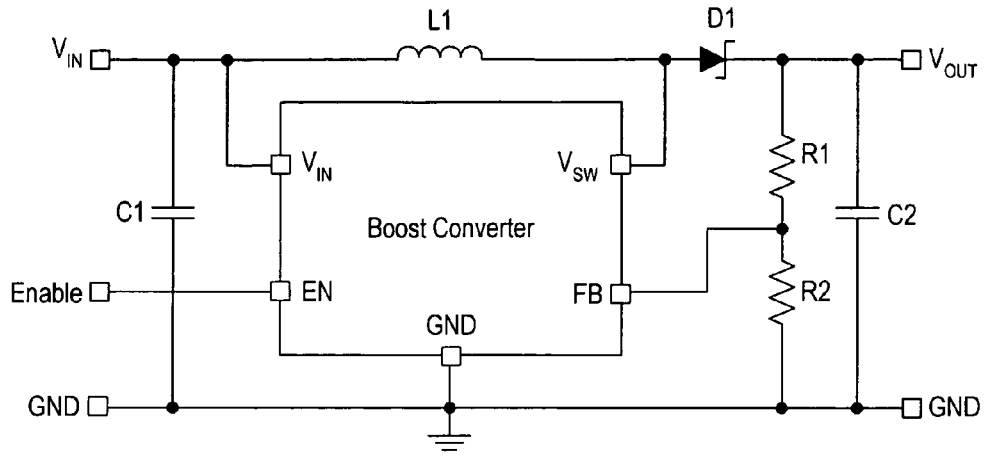
FIG. 1 is a circuit diagram illustrating a typical circuit configuration of a conventional non-synchronous boost converter.
Figure 2:
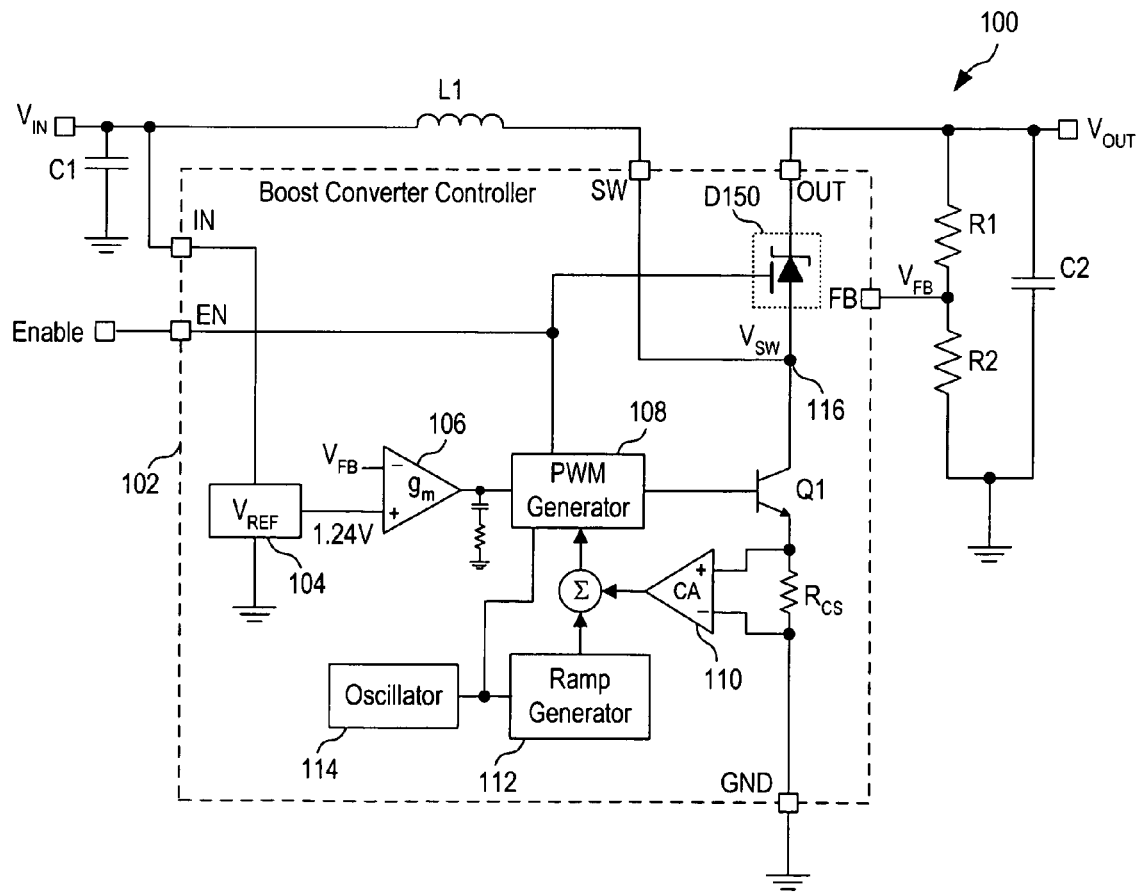
FIG. 2 is circuit diagram of a non-synchronous boost converter incorporating a switched Schottky diode according to one embodiment of the present invention.

FIG. 2 is circuit diagram of a non-synchronous boost converter incorporating a switched Schottky diode according to one embodiment of the present invention. FIG. 2 illustrates a functional block diagram of a constant frequency, PWM current mode boost converter (also called "boost regulator"). The boost converter of FIG. 2 is illustrative only and is not intended to be limiting. Specifically, the exact configuration of the boost converter is not critical to the practice of the present invention. The boost converter of FIG. 2 is provided to illustrate an exemplary configuration of a boost converter and to illustrate the incorporation of the switched Schottky diode in the boost converter for realizing true disconnect from output voltage to load. One of ordinary skill in the art would appreciate that the switched Schottky diode can be incorporated in boost converters of other configurations to realize the same true disconnect function.

In the embodiment shown in FIG. 2, boost converter 100 includes an oscillator 114, a slope compensation ramp generator 112, a current amplifier 110, a $g_m$ (transconductance) error amplifier 106, a PWM generator 108, and a bipolar transistor Q1 as the output transistor. Oscillator 114 generates a clock signal of a predetermined frequency. For example, the clock frequency can be 1.2 MHz. The clock signal serves two functions. First, the clock signal trigger PWM generator 108 which in turn turns on output transistor Q1. Second, the clock signal reset slop compensation ramp generator 112. Current amplifier 110 measures the switch current by amplifying a voltage signal from a sense resistor Rcs connected in series with the emitter terminal of output transistor Q1. The output signal of current amplifier 110 is summed with the output signal of ramp generator 112. The summed current-loop signal is fed to PWM generator 108 as a first input signal.

Besides the summed current-loop signal, PWM generator 108 also receives an input signal from the $g_m$ error amplifier 106. The $g_m$ error amplifier 106 measures the feedback voltage ($V_{FB}$) through the feedback resistors R1 and R2 and amplifies the error between the feedback voltage $V_{FB}$ and a reference voltage. In the present illustration, the reference voltage is a 1.24 volts bandgap voltage generated by reference voltage circuit 104. The output signal of $g_m$ error amplifier 106 provides the voltage-loop signal that is fed to PWM generator 108 as a second input signal. PWM generator 108 generates an output signal driving the base terminal of output transistor Q1. When the current-loop signal exceeds the voltage-loop signal, the PWM generator turns off the bipolar output transistor Q1. At the next clock period, the next switching cycle is initiated, thereby maintaining the constant frequency current-mode pulse-width modulation (PWM) control. In this manner, a switched output voltage $V_{SW}$ is generated at the collector terminal of output transistor Q1 (node 116).

To complete the boost converter circuit, boost converter 100 further includes an inductor L1 coupled between the input voltage VIN and the switched output voltage $V_{SW}$. An input capacitor C1 may be coupled to the input voltage VIN terminal for noise immunity. Boost converter 100 operates by receiving a DC input voltage $V_{IN}$ and regulating a higher DC output voltage $V_{OUT}$. The operation of boost converter 100 requires a Schottky diode to be coupled to the switched output voltage node to rectify the switched output voltage $V_{SW}$, thereby providing the DC output voltage $V_{OUT}$. A voltage divider formed by resistors R1 and R2 is coupled to the output voltage $V_{OUT}$ to generate the feedback voltage $V_{FB}$ to be fed back to $g_m$ error amplifier 106. An output capacitor C2 may be coupled to output voltage $V_{OUT}$ to filter the output voltage signal, improving the transient response.

In accordance with the present invention, a switched Schottky diode D150 is incorporated in boost converter 100 to implement the rectification function. Switched Schottky diode D150 includes an anode terminal coupled to the switched output voltage $V_{SW}$ (node 116), a cathode coupled to the output voltage $V_{OUT}$ node and a gate terminal receiving an enable signal EN. As will be explained in more detail below, switched Schottky diode D150 can be turned on or off through the control of the gate terminal so that Schottky diode D150 can be turned off when boost converter 100 is turned off. In this manner, the DC current path through the Schottky diode between the switched output voltage $V_{SW}$ and the load coupled to the output voltage $V_{OUT}$ node can be shut off to eliminate the leakage current flow.

Boost regulation in boost converter 100 is achieved by turning on output transistor Q1, which draws current through inductor L1, storing energy in the magnetic field. When output transistor Q1 is turned off by control of PWM generator 108, inductor L1's magnetic field collapses, the voltage $V_{SW}$ at the switch node (116) increases until Schottky diode D150 is forward-biased, causing current to be discharged into output capacitor C2.

Boost converter 100 further receives an Enable signal which operates to enable the boost converter or shut-down the boost converter when desired. The Enable signal is coupled to PWM generator 108 to turn off the PWM generator when the Enable signal is deasserted to disable the converter. The Enable signal is also coupled to drive the gate terminal of switched Schottky diode D150 to turn off the Schottky diode, regardless of the bias condition of the Schottky diode, when the converter is to be turned off.

It is important to note that the arrangement of the circuit elements in the boost converter of FIG. 2 to generate the switched output voltage $V_{SW}$ is illustrative only. As mentioned above, other circuit arrangements for forming the boost converter to generate the switched output voltage based on a DC input voltage can be used. Furthermore, the boost converter may include other circuit components, such as circuitry for overvoltage protection, that are not shown in FIG. 2.

In accordance with the present invention, Schottky diode D150 is implemented as a switched Schottky diode. In the present description, a switched Schottky diode refers to a Schottky diode that incorporates a gate terminal for receiving a control signal to turn the Schottky diode on or off. When the control signal coupled to the gate terminal is asserted to turn the switched Schottky diode on, the switched Schottky diode operates as a normal Schottky diode where the Schottky diode conducts current when forward biased.

When the control signal coupled to the gate terminal is deasserted to turn the switched Schottky diode off, no current flows through the switched Schottky diode even when the anode terminal is forward biased relative to the cathode terminal. Thus, the gate terminal of the switched Schottky diode can be used to block the forward conduction of the diode, thereby providing on-off control of the Schottky diode.

Boost converter 100 of FIG. 2 incorporates the switched Schottky diode of the present invention to realize a true disconnect function between the switched output voltage $V_{SW}$ and the output load coupled to the DC output voltage. Specifically, switched Schottky diode D150 has an anode terminal coupled to the switched output voltage $V_{SW}$ (node 116) and a cathode terminal providing the DC output voltage $V_{OUT}$ of the boost converter to which output load is coupled. The switched Schottky diode includes a gate terminal coupled to receive a control signal for turning the switched Schottky diode on and off. In the present embodiment, the Enable signal for enabling or disabling the boost converter is used to control the switched Schottky diode. When the Enable signal coupled to the gate terminal is asserted to turn the switched Schottky diode on, the switched Schottky diode operates as a normal Schottky diode. When the Enable signal coupled to the gate terminal is deasserted to turn the switched Schottky diode off, no forward current flows through the switched Schottky diode even when the anode terminal is forward biased relative to the cathode terminal.

In one embodiment, the switched Schottky diode is implemented as a "JFET controlled Schottky diode." A JFET controlled Schottky diode is described in commonly assigned U.S. patent application Ser. No. 11/051,520, entitled "JFET Controlled Schottky Barrier Diode," of Shekar Mallikarjunaswamy. A JFET controlled Schottky diode includes an integrated junction field-effect transistor (JFET) for providing on-off control of the Schottky diode. The JFET controlled Schottky diode realizes forward conduction blocking through the use of JEFT action in response to a gate control signal.

In one embodiment, a p-type diffusion region is integrated into the cathode of the Schottky diode to realize a reverse biased p-n junction where the p-n junction operates to pinch off the forward current of the Schottky diode through JFET action. The JFET controlled Schottky diode is turned on by the application of a gate to anode voltage equal to or greater than the pinch-off voltage of the JFET. When enabled, the JFET controlled Schottky diode operates as a conventional Schottky diode. The JFET controlled Schottky diode can be turned off by the application of a gate to anode voltage that is less than the pinch-off voltage of the JFET. In that case, regardless of the anode to cathode voltage, the Schottky diode is disabled and no forward current will be passed.

In another embodiment, the switched Schottky diode is implemented as an "LDMOS gate controlled Schottky diode." A LDMOS gate controlled Schottky diode is described in commonly assigned U.S. patent application Ser. No. 11/031,201, entitled "LDMOS Gate Controlled Schottky Diode," of Shekar Mallikarjunaswamy. The LDMOS gate controlled Schottky diode includes a Schottky diode and a LDMOS device coupled in series with the Schottky diode. In a preferred embodiment, a forward current from the Schottky diode is allowed to flow through the channel of a depletion mode LDMOS that allows gate control over Schottky forward current. Integrating the Schottky diode into the drain of the depletion mode LDMOS forms the device structure.

Referring again to FIG. 2, boost converter 100 is usually formed using an integrated circuit with external passive components where the integrated circuit incorporates the control circuitry of the boost converter and is sometimes referred to as the "boost converter controller IC." In FIG. 2, the electrical components within the dotted-line box 102 form a single integrated circuit as the boost converter controller IC and external electrical components, such as resistors, capacitors and inductors, are connected to terminals of the integrated circuit to complete the boost converter. In the present illustration, the integrated circuit includes an input voltage terminal IN receiving the input voltage $V_{IN}$, a ground voltage terminal GND coupled to the ground or a negative power supply voltage, a switched output voltage terminal SW providing the switched output voltage $V_{SW}$, a feedback voltage terminal FB receiving the feedback voltage $V_{FB}$, and an enable input terminal EN receiving the Enable control signal.

In the present embodiment, the switched Schottky diode of the present invention is an on-chip Schottky diode integrated on the same integrated circuit of the boost converter controller IC. When an on-chip switched Schottky diode is used, the boost converter controller IC further includes an output voltage terminal OUT for providing the rectified DC output voltage $V_{OUT}$. In other embodiments, the switched Schottky diode of the present invention can be formed as a separate electrical component and coupled off-chip to the integrated circuit of the boost converter controller IC. In that case, the anode of the switched Schottky diode is coupled to the SW terminal of the boost converter controller IC and the cathode of the switched Schottky diode provides the DC output voltage $V_{OUT}$. The gate terminal of the Schottky diode is coupled to receive a control signal, such as the Enable signal, for controlling the on-off function of the Schottky diode.

In the above described embodiments, the control signal coupled to the gate terminal of the switched Schottky diode is the Enable signal of the boost converter. This is illustrative only and in other embodiments, other control signals can be used to control the on-off function of the switched Schottky diode. In general, the control signal for the switched Schottky diode conforms to the Enable signal of the boost converter so that the control signal turns on the Schottky diode when the boost converter is turned on and turns off the Schottky diode when the boost converter is turned off.

As described above, a conventional Schottky diode incorporated in a boost converter forms a DC current path between the switched output voltage $V_{SW}$ and the load, resulting in undesired leakage current flow when the boost converter is disabled. When the switched Schottky diode is used in the boost converter in accordance with the present invention, the switched Schottky diode can be turned off when the boost converter is disabled to shut off the leakage current path through the Schottky diode. The boost converter of the present invention has particular application in portable devices where the DC leakage path through the Schottky diode can be turned off when the converter is disabled. In this manner, the power supply, such as a battery, of the portable device is not drained off and the battery-life of the portable device can be extended.

The above detailed descriptions are provided to illustrate specific embodiments of the present invention and are not intended to be limiting. Numerous modifications and variations within the scope of the present invention are possible. The present invention is defined by the appended claims.

We claim:

1. A non-synchronous boost converter receiving an input DC voltage and providing an output DC voltage greater than the input DC voltage, the boost converter comprising:

a controller coupled to receive the input DC voltage on an input voltage terminal and generate a switched output voltage on a switched output voltage terminal, the controller further receiving an enable signal on an enable terminal and a feedback voltage on a feedback terminal, the enable signal being asserted to turn on the boost converter and being deasserted to turn off the boost converter;

a switched Schottky diode having an anode terminal coupled to the switched output voltage terminal, a cathode terminal providing the output DC voltage, and a gate terminal coupled to receive a control signal, the control signal having a first state for turning the switched Schottky diode on where the switched Schottky diode conducts current when forward biased and a second state for turning the switched Schottky diode off where forward conduction of the switched Schottky diode is blocked even when the switched Schottky diode is forward biased, the control signal being related to the enable signal;

an inductor coupled between the input DC voltage terminal and the switched output voltage terminal;

a capacitor coupled between the output voltage terminal and a first power supply voltage; and a voltage divider coupled between the output voltage terminal and the first power supply voltage, the voltage divider providing the feedback voltage at an output node of the voltage divider.

2. The boost converter of claim 1, wherein when the enable signal is deasserted to turn off the boost converter, the control signal has a second state for turning off the switched Schottky diode.

3. The boost converter of claim 2, wherein the control signal is the enable signal.

4. The boost converter of claim 1, wherein the switched Schottky diode comprises a JFET controlled Schottky diode where the forward conduction of the Schottky diode is blocked through JFET action in response to the control signal having the second state.

5. The boost converter of claim 1, wherein the switched Schottky diode comprises an LDMOS gate controlled Schottky diode where the forward current of the Schottky diode flows through the channel of an LDMOS transistor and the forward current is blocked through gate control action of the LDMOS transistor in response to the control signal having the second state.

6. The boost converter of claim 1, wherein the controller is formed on an integrated circuit and the switched Schottky diode is formed in the same integrated circuit in which the controller is formed.

7. The boost converter of claim 1, wherein the controller is formed on an integrated circuit and the switched Schottky diode is formed in a second integrated circuit separate from the integrated circuit in which the controller is formed.

8. The boost converter of claim 1, wherein the controller comprises:

a voltage reference circuit coupled to receive the input voltage and to generate a reference voltage;

a transconductance error amplifier coupled to receive the reference voltage and the feedback voltage and providing a voltage-loop control signal;

an output transistor having a control terminal coupled to receive an output control signal, a first current handling terminal coupled to the first power supply voltage through a current-sense resistor and a second current handling terminal providing the switched output voltage;

a current sense amplifier for sensing a voltage across the current-sense resistor and providing a first signal;

an oscillator providing a clock signal of a predetermined frequency;

a ramp generator coupled to receive the clock signal and generating a ramp signal;

a summer circuit coupled to sum the first signal and the ramp signal, the summer circuit providing a current-loop control signal; and a PWM generator coupled to receive the voltage-loop control signal and the current-loop control signal and generate the output control signal driving the output transistor, the enable signal being coupled to the PWM generator for turning the PWM generator on when the enable signal is asserted and turning the PWM generator off when the enable signal is deasserted.

9. The boost converter of claim 8, wherein the output transistor comprises a bipolar transistor.

10. The boost converter of claim 8, wherein the output transistor comprises a MOSFET transistor.

11. The boost converter of claim 10, wherein the output transistor comprises an N-channel MOSFET transistor.

12. The boost converter of claim 1, wherein the voltage divider comprises a first resistor and a second resistor coupled in series between the output voltage terminal and the first power supply voltage, the common node of the first resistor and the second resistor providing the feedback voltage.

* * * * *